United States Patent
Kim et al.

(10) Patent No.: US 8,835,774 B2
(45) Date of Patent: Sep. 16, 2014

(54) CIRCUIT BOARD ASSEMBLY AND METHOD OF ASSEMBLING CIRCUIT BOARDS

(75) Inventors: Hyun-seok Kim, Suwon-si (KR); Inh-seok Suh, Yongin-si (KR); Tak-kyoum Kim, Gwacheon-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 120 days.

(21) Appl. No.: 13/283,824

(22) Filed: Oct. 28, 2011

(65) Prior Publication Data

US 2012/0305293 A1    Dec. 6, 2012

(30) Foreign Application Priority Data

May 30, 2011    (KR) .................. 10-2011-0051670

(51) Int. Cl.
*H05K 1/16* (2006.01)
*H05K 1/11* (2006.01)

(52) U.S. Cl.
USPC ........................ 174/260; 174/262; 361/792

(58) Field of Classification Search
USPC ............... 361/792–795; 174/260, 262–266
See application file for complete search history.

(56) References Cited

U.S. PATENT DOCUMENTS

| 5,854,534 A * | 12/1998 | Beilin et al. | 257/691 |
| 5,973,927 A * | 10/1999 | Tanaka | 361/760 |
| 6,984,456 B2 * | 1/2006 | Okada et al. | 428/621 |
| 2004/0118596 A1 * | 6/2004 | Fuller et al. | 174/255 |

FOREIGN PATENT DOCUMENTS

| KR | 1020050083577 A | 8/2005 |
| KR | 1020100031048 A | 3/2010 |

\* cited by examiner

*Primary Examiner* — Jeremy C Norris
(74) *Attorney, Agent, or Firm* — Drinker Biddle & Reath LLP

(57) ABSTRACT

According to an aspect of the invention, there is provided a circuit board assembly including a first circuit board including a first circuit pattern formed on a surface of the first circuit board, and an opening that is adjacent to the first circuit pattern; and a second circuit board including a second circuit pattern corresponding to the first circuit pattern and a protection film that is applied to a surface of the second circuit board so as to form a hollow place located corresponding to the opening, wherein the first circuit board and the second circuit board are combined with each other.

13 Claims, 5 Drawing Sheets

CIRCUIT BOARD ASSEMBLY AND METHOD OF ASSEMBLING CIRCUIT BOARDS

CROSS-REFERENCE TO RELATED PATENT APPLICATION

This application claims the priority benefit of Korean Patent Application No. 10-2011-0051670, filed on May 30, 2011, in the Korean Intellectual Property Office, the entirety of which is incorporated herein by reference.

BACKGROUND

1. Field of the Invention

The invention relates to a circuit board assembly and a method of assembling circuit boards, and more particularly, to a circuit board assembly and a method of assembling circuit boards that enable an assembling process to be performed easily, and a circuit pattern to be connected precisely.

2. Description of the Related Art

Electronic products manufactured by assembling various electronic parts may include a plurality of circuit boards. The circuit boards may be connected to each other or to an external connection terminal using a flexible circuit board.

When a hard circuit board is electrically connected to a flexible circuit board, a connector may be used, or a compression method involving heating may be used. However, in the former case, the need for a separate part leads to increased manufacturing costs, and the connector occupies a large space, thus, it is difficult to make products having small sizes. Also, in the latter case, when a flexible circuit board and a hard circuit board are brought into contact and compression is applied thereto, air may not fully escape the contact area, and thus a circuit pattern connection may have a defect or one or more connections may be unreliable.

SUMMARY

The invention provides a circuit board assembly and a method of assembling circuit boards that enable an assembling process to be performed easily, a circuit pattern to be connected precisely, and a circuit board assembly to be manufactured in a small size.

According to an aspect of the invention, there is provided a circuit board assembly including: a first circuit board including a first circuit pattern formed on a surface of the first circuit board, and an opening that is adjacent to the first circuit pattern; and a second circuit board including a second circuit pattern corresponding to the first circuit pattern and a protection film that is applied to a surface of the second circuit board so as to form a hollow place located corresponding to the opening, wherein the first circuit board and the second circuit board are combined with each other.

The first circuit board may have a flexible property.

The hollow place may be larger than the opening.

An electrically conductive adhesive may be disposed between the first circuit pattern and the second circuit pattern.

The first circuit board may include a first solder portion that is spaced apart from the first circuit pattern, and the second circuit board may include a second solder portion that is disposed corresponding to the first solder portion and is combined with the first solder portion using a solder.

The first circuit pattern and the second circuit pattern may be combined with each other using a solder.

According to another aspect of the invention, there is provided a method of assembling circuit boards including: preparing a first circuit board including a first circuit pattern formed on a surface of the first circuit board, and an opening that is adjacent to the first circuit pattern; preparing a second circuit board including a second circuit pattern corresponding to the first circuit pattern; applying a protection film on a surface of the second circuit board so as to form a hollow place located corresponding to the opening; and combining the first circuit board and the second circuit board.

The combining of the first circuit board and the second circuit board may include: disposing an electrically conductive adhesive between the first circuit pattern and the second circuit pattern; and compressing the first circuit board and the second circuit board.

The method may further include applying a solder to the surface of either the first circuit pattern or the second circuit pattern, wherein the combining of the first circuit board and the second circuit board may include: contacting the first circuit board and the second circuit board in such a way that the first circuit pattern contacts the second circuit pattern; and heating a contact portion between the first circuit board and the second circuit board.

BRIEF DESCRIPTION OF THE DRAWINGS

The above and other features and advantages of the invention will become more apparent by describing in detail exemplary embodiments thereof with reference to the attached drawings in which.

DETAILED DESCRIPTION

Hereinafter, embodiments of a circuit board assembly and a method of assembling circuit boards will now be described in detail with reference to the attached drawings.

Figure 1:
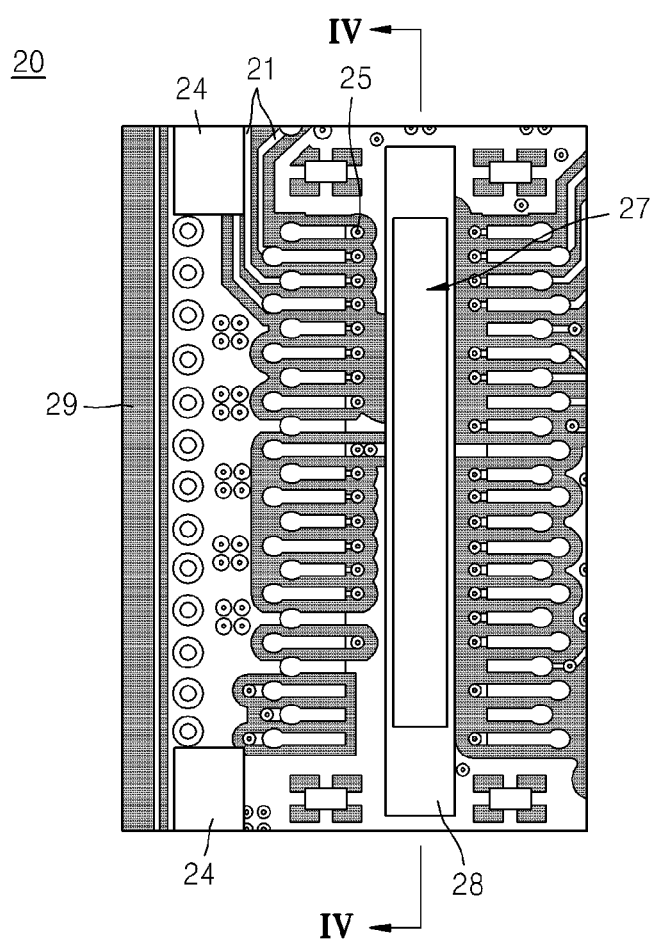
FIG. 1 is a plan view of a second circuit board of a circuit board assembly, according to an embodiment of the invention.
Figure 2:
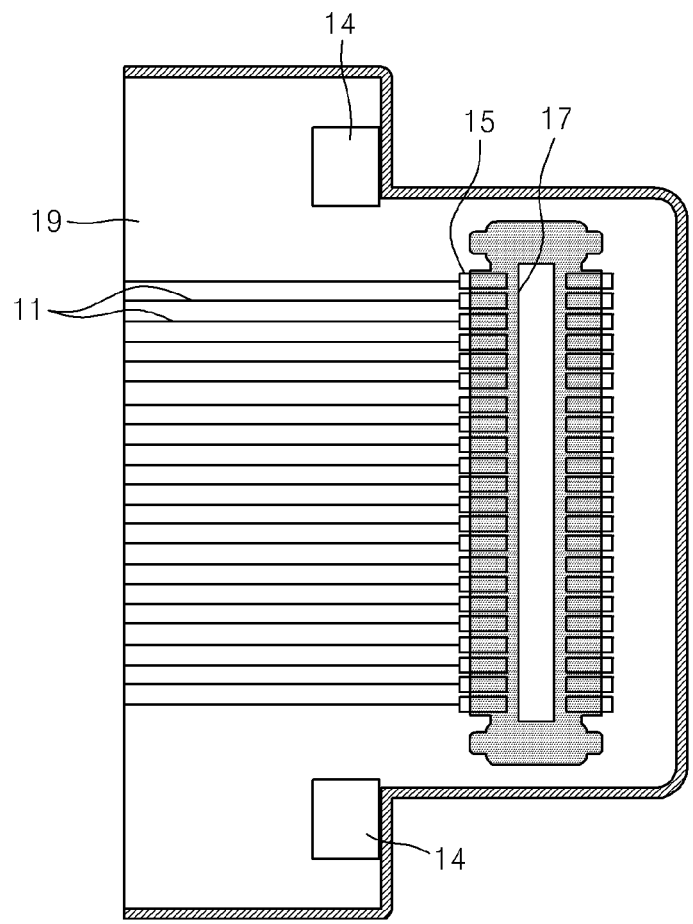
FIG. 2 is a plan view of a first circuit board of the circuit board assembly of FIG. 1.
Figure 3:
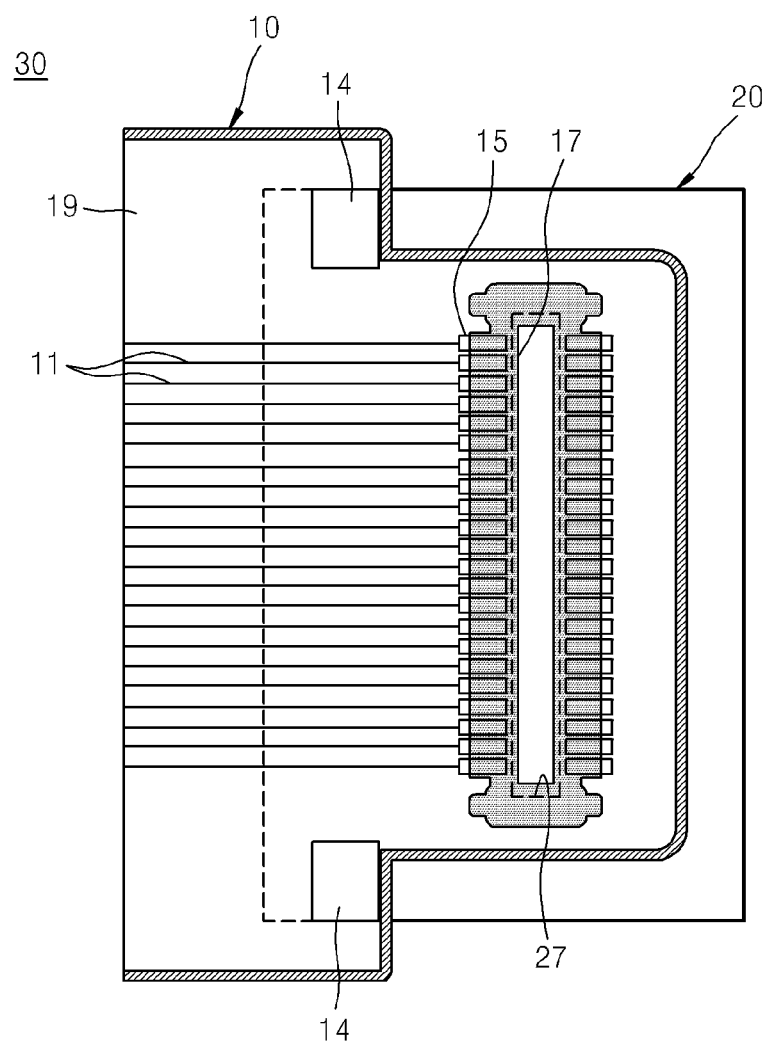
FIG. 3 is a schematic plan view illustrating an assembled state of the second circuit board of FIG. 1 and the first circuit board of FIG. 2, according to an embodiment of the invention.

FIG. 1 is a plan view of a second circuit board 20 of a circuit board assembly, according to an embodiment of the invention, FIG. 2 is a plan view of a first circuit board 10 of the circuit board assembly, and FIG. 3 is a schematic plan view illustrating an assembled state 30 of the second circuit board 20 of FIG. 1 and the first circuit board 10 of FIG. 2.

A circuit board assembly 30 regarding the embodiment illustrated in FIGS. 1 to 3 includes the first circuit board 10 and the second circuit board 20. In the illustrated embodiment, the first circuit board 10 is manufactured using a flexible material, such as a polyimide resin, and thus has flexible properties. The second circuit board 20, which is to be combined with the first circuit board 10, is manufactured using a hard material, and thus has non-flexible properties. For example, the second circuit board 20 is a typical printed circuit board.

However, embodiments of the invention are not limited to such characteristics of the first circuit board 10 and the second circuit board 20. For example, a hard printed circuit board may instead be used as the first circuit board 10 and a flexible printed circuit board may instead be used as the second circuit board 20. Alternatively, flexible printed circuit boards may be used as the first and second circuit boards 10 and 20.

Referring to FIG. 2, the first circuit board 10 includes a flexible substrate portion 19 manufactured using a flexible material, such as a polyimide resin, a first circuit pattern 15 formed on a surface of the flexible substrate portion 19, and an opening 17 that is adjacent to the first circuit pattern 15 and is formed through the first circuit board 10.

The first circuit board 10 includes an interconnection portion 11 that is electrically connected to the first circuit pattern 15 and extends along the surface of the flexible substrate portion 19. The interconnection portion 11 and the first circuit pattern 15 may be formed on the surface of the flexible substrate portion 19 by printing an electrically conductive material; forming and etching a copper film on the surface of the flexible substrate portion 19 to form a pattern; plating; or a combination thereof.

The first circuit pattern 15 functions as a terminal that is electrically connected to the second circuit board 20. The first circuit board 10 may include a plurality of the first circuit patterns 15 consecutively disposed as illustrated in FIG. 2. The opening 17 may extend in a direction in which the first circuit patterns 15 are aligned.

Referring to FIG. 1, the second circuit board 20 includes a second circuit pattern 25 formed on a surface thereof corresponding to the first circuit pattern 15 of the first circuit board 10, and a hollow place 27 formed corresponding to the opening 17.

The hollow place 27 may be formed by a protection film 28 applied on the surface of the second circuit board 20.

The second circuit board 20 includes a hard substrate portion 29 manufactured using a hard insulating resin material, the second circuit pattern 25 formed on the surface of the hard substrate portion 29, and an interconnection portion 21 that is electrically connected to the second circuit pattern 25 and extends along the surface of the hard substrate portion 29. The interconnection portion 21 and the second circuit pattern 25 may each be formed on the surface of the hard substrate portion 29 by plating, printing, etching, or a combination thereof.

The second circuit pattern 25 functions as a terminal that is electrically connected to the first circuit board 10, and is electrically connected to the first circuit pattern 15 of the first circuit board 10.

The protection film 28 applied to the surface of the second circuit board 20 may be formed of a solder resist. The solder resist prevents undesired attachment of a solder to a portion of a printed circuit board and protects a circuit pattern of the printed circuit board when a solder is applied to the printed circuit board to mount electronic parts. Examples of the solder resist are a photo solder resist and a liquid photo imaging resist.

Figure 4:
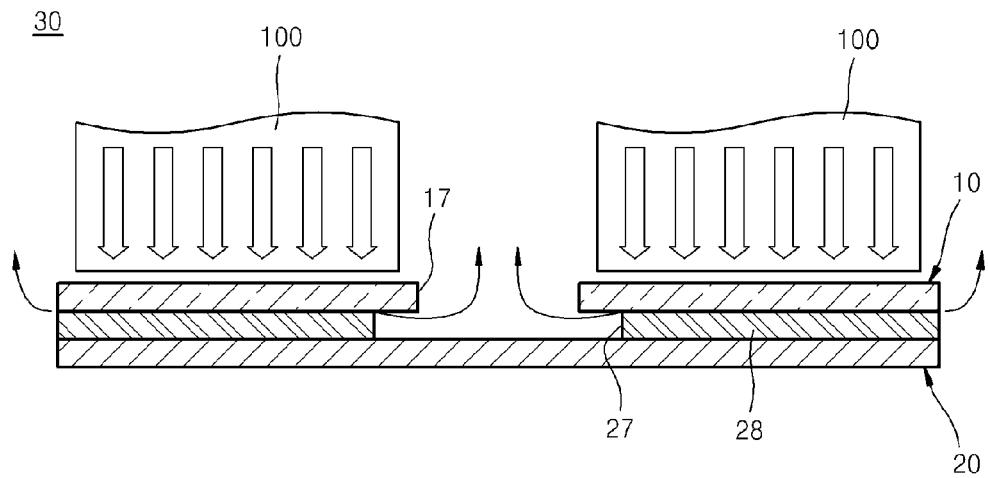
FIG. 4 is a cross-sectional view of a portion of the circuit board assembly of FIG. 3 taken along line IV-IV of FIG. 1, according to an embodiment of the invention.

FIG. 4 is a cross-sectional view of a portion of the circuit board assembly 30 of FIG. 3 taken along line IV-IV of FIG. 1.

To combine the first circuit board 10 with the second circuit board 20, the circuit board 10 and the second circuit board 20 are compressed while the first circuit pattern 15 contacts the second circuit pattern 25.

FIG. 4 illustrates a compression tool 100 for applying pressure to the first circuit board 10 and the second circuit board 20. In a case in which the surface of the first circuit pattern 15 or the second circuit pattern 25 is coated with a solder, pressure or heat may be applied to the first circuit board 10 and the second circuit board 20 via the compression tool 100. Due to the applied heat, the solder may be molten and thus the first circuit pattern 15 may be electrically connected to the second circuit pattern 25.

Embodiments may not be limited to the method of combining the first circuit board 10 and the second circuit board 20 described above. For example, an electrically conductive adhesive may be disposed between the first circuit pattern 15 and the second circuit pattern 25, pressure may be applied to the first circuit board 10 and the second circuit board 20, and then the electrically conductive adhesive may be hardened.

Examples of the electrically conductive adhesive are anisotropic conductive adhesives (ACAs), such as an anisotropic conductive film (ACF).

The hollow place 27 of the second circuit board 20 may be larger than the opening 17 of the first circuit board 10. Referring to FIG. 4, when the first circuit board 10 is combined with the second circuit board 20 by compression, air between the first circuit board 10 and the second circuit board 20 may flow out to the outside the circuit board assembly 30 via the hollow place 27 and the opening 17. FIG. 4 illustrates arrows indicating paths of air flowing to the outside of the circuit board assembly 30.

As described above, by forming the hollow place 27 to be larger than the opening 17, air and heat may be easily discharged to the outside of the circuit board assembly 30 when the first circuit board 10 is combined with the second circuit board 20. Thus, the assembling of the first circuit board 10 and the second circuit board 20 may be performed precisely and stably.

Referring to FIGS. 1 and 2, the first circuit board 10 may include a first solder portion 14 that is spaced apart from the first circuit pattern 15, and the second circuit board 20 may include a second solder portion 24 disposed corresponding to the first solder portion 14. When the first circuit board 10 is combined with the second circuit board 20, the first solder portion 14 and the second solder portion 24 may be combined by performing soldering, and thus the assembled state of the first circuit board 10 and the second circuit board 20 may be maintained strongly.

Figure 5:
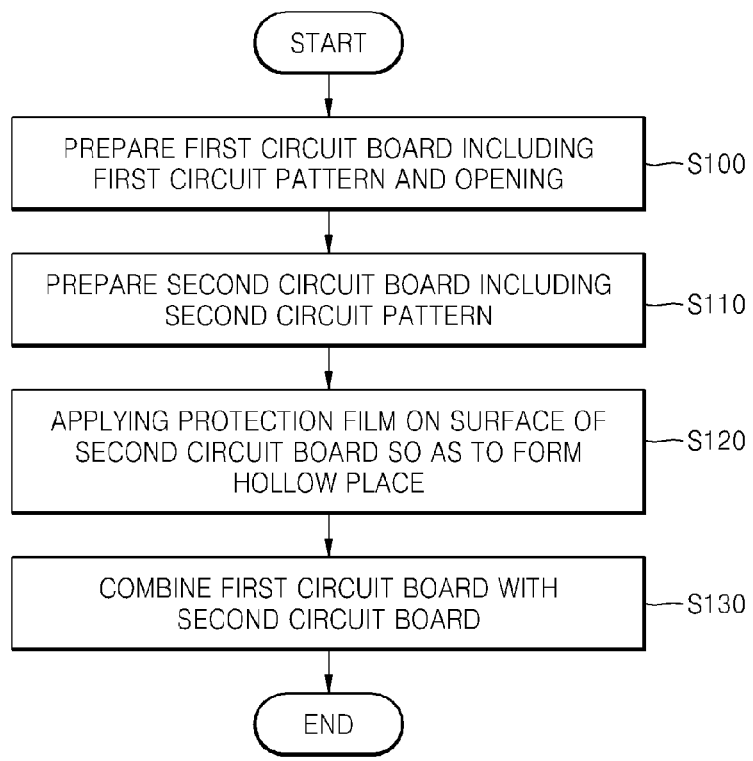
FIG. 5 is a flowchart illustrating a method of assembling circuit boards, according to an embodiment of the invention.

FIG. 5 is a flowchart illustrating a method of assembling circuit boards according to an embodiment of the invention.

Referring to FIG. 5, the method of assembling circuit boards includes preparing a first circuit board (operation S100), preparing a second circuit board (operation S110), applying a protection film on a surface of the second circuit board (operation S120), and combining the first circuit board and the second circuit board (operation S130).

In the operation S100 of preparing a first circuit board, the first circuit board 10 illustrated in FIG. 2, which includes the first circuit pattern 15 disposed on the surface thereof and the opening 17 formed adjacent to the first circuit pattern 15 and has flexible properties is prepared.

In the operation S110 of preparing a second circuit board, the second circuit board 20 illustrated in FIG. 1, which includes the second circuit pattern 25 disposed on the surface thereof and has non-flexible properties is prepared.

Once the second circuit board 20 is prepared, the protection film 28 is applied on the surface of the second circuit board 20 to form the hollow place 27 corresponding to the opening 17 of the first circuit board 10 (operation S120.) In this regard, the hollow place 27 may be formed larger than the opening 17.

Once the first circuit board 10 and the second circuit board 20 are prepared, the first circuit pattern 15 is combined with the second circuit pattern 25 in such a way that the first circuit board 10 is electrically connected to the second circuit board 20 (operation S130.)

The combining of the first circuit board 10 and the second circuit board 20 (operation S130) may include disposing an electrically conductive adhesive between the first circuit pattern 15 and the second circuit pattern 25, and compressing the first circuit board 10 and the second circuit board 20.

Also, the combining of the first circuit board 10 and the second circuit board 20 (operation S130) may be modified. For example, first, a solder may be applied to the surface of the first circuit pattern 15 or the second circuit pattern 25, then the first circuit board 10 brought into contact with the second circuit board 20, and a contact portion between the first circuit board 10 and the second circuit board 20 heated, thus, combining the first circuit board 10 with the second circuit board 20.

Figure 6:
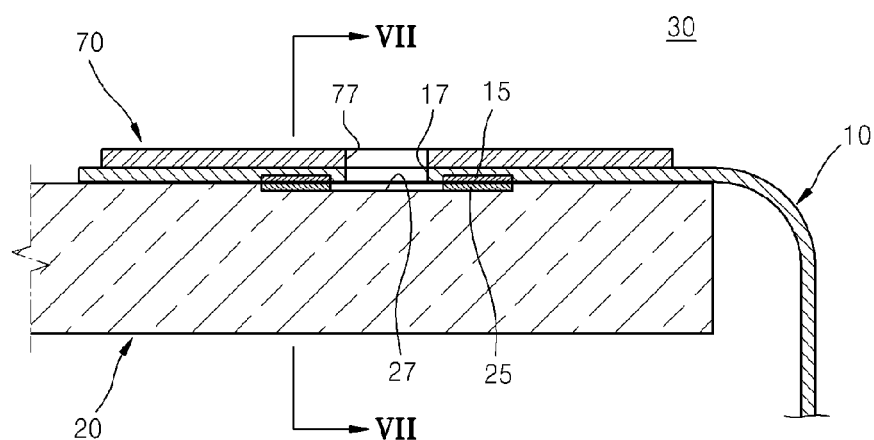
FIG. 6 is a cross-sectional view of a circuit board assembly according, to another embodiment of the invention.
Figure 7:
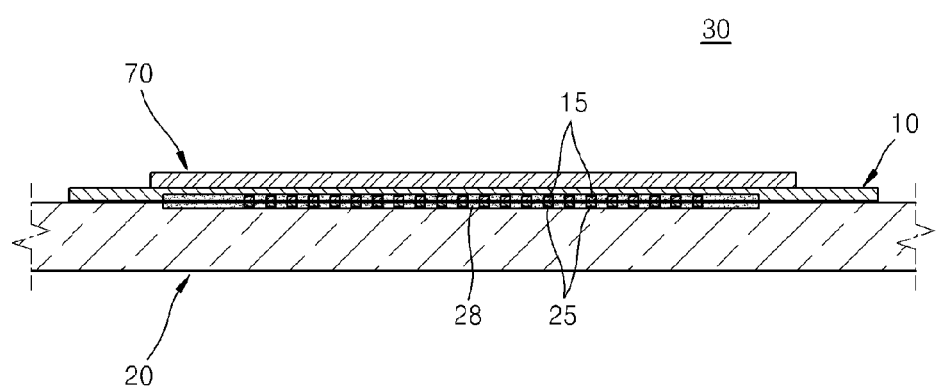
FIG. 7 is a cross-sectional view taken along a line VII-VII of the circuit board assembly of FIG. 6.

FIG. 6 is a cross-sectional view of the circuit board assembly 30 according to another embodiment of the invention, and FIG. 7 is a cross-sectional view taken along a line VII-VII of the circuit board assembly 30 of FIG. 6.

The circuit board assembly 30 according the embodiment illustrated in FIGS. 6 and 7 is similar to that according to the embodiment illustrated in FIGS. 1 to 4. Accordingly, like reference numerals are used to denote like elements.

The circuit board assembly 30 includes the first circuit board 10 having flexible properties and the hard second circuit board 20 having non-flexible properties.

The first circuit board 10 includes the first circuit pattern 15 for electrical connection with the second circuit board 20, and the second circuit board 20 includes the second circuit pattern 25 corresponding to the first circuit pattern 15.

The first circuit board 10 includes the opening 17, which extends in the direction in which the first circuit patterns 15 are aligned and is formed through the first circuit board 10, and the second circuit board 20 includes the hollow place 27 disposed corresponding to the opening 17. The hollow place 27 may be formed using the protection film 28 applied on the surface of the second circuit board 20. In FIG. 6, the first circuit pattern 15 and the second circuit pattern 25 of the first circuit board 10 and the second circuit board 20 are illustrated, and thus the protection film 28 applied on the hollow place 27 is not illustrated. Since a location of the protection film 28 for forming the hollow place 27 is similar to that in the embodiment illustrated in FIGS. 1 to 4, it may be understood that the protection film 28 is applied in a way similar to that explained with reference to FIG. 4.

In the example of FIGS. 6 and 7, the first circuit board 10 includes a reinforce portion 70 disposed surrounding at least a portion of the opening 17. The reinforce portion 70 is manufactured using, for example, a resin material, such as polyimide, or a metallic material, such as stainless steel (SUS), and has non-flexible properties so that the reinforce portion 70 is not bendable compared to the first circuit board 10. The reinforce portion 70 includes an aperture 77 corresponding to the opening 17.

Handling of the first circuit board 10 may be difficult during an assembling process due to its flexibility. The reinforce portion 70 may support the first circuit board 10 by being attached to a side of the first circuit board 10 having flexible properties. To assemble the first circuit board 10 with the second circuit board 20, the first circuit board 10 is brought into contact with the second circuit board 20. The first circuit board 10 may be transferred using the reinforce portion 70, and also, heat or pressure may be applied to the reinforce portion 70.

When the first circuit board 10 is brought into contact with the second circuit board 20 and pressure is applied to the first and second circuit boards 10 and 20, air and heat between the first circuit board 10 and the second circuit board 20 may be discharged through the hollow place 27, the opening 17, and the aperture 77.

Regarding the circuit board assemblies and the method of assembling circuit boards according to the above embodiments, due to an opening of a first circuit board and a hollow place of a second circuit board, a space for discharging air and heat when the first circuit board and the second circuit board are assembled is provided. Thus, the assembling may be performed easily and precisely, and a space in which the circuit board assembly is to be disposed may be minimized.

The circuit board assemblies described above may comprise a memory for storing program data, a processor for executing the program data, a permanent storage such as a disk drive, a communications port for handling communications with external devices, and user interface devices, including a display, keys, etc. When software modules are involved, these software modules may be stored as program instructions or computer-readable codes, which are executable by the processor, on a non-transitory or tangible computer-readable media such as read-only memory (ROM), random-access memory (RAM), a compact disc (CD), a digital versatile disc (DVD), magnetic tapes, floppy disks, optical data storage devices, an electronic storage media (e.g., an integrated circuit (IC), an electronically erasable programmable read-only memory (EEPROM), and/or a flash memory), a quantum storage device, a cache, and/or any other storage media in which information may be stored for any duration (e.g., for extended time periods, permanently, brief instances, for temporarily buffering, and/or for caching of the information). The computer-readable recording medium can also be distributed over network-coupled computer systems (e.g., a network-attached storage device, a server-based storage device, and/or a shared network storage device) so that the computer-readable code may be stored and executed in a distributed fashion. This media can be read by the computer, stored in the memory, and executed by the processor. As used herein, a computer-readable storage medium excludes any computer-readable media on which signals may be propagated. However, a computer-readable storage medium may include internal signal traces and/or internal signal paths carrying electrical signals therein.

Any references, including publications, patent applications, and patents, cited herein are hereby incorporated by reference to the same extent as if each reference were individually and specifically indicated to be incorporated by reference and were set forth in its entirety herein.

For the purposes of promoting an understanding of the principles of the invention, reference has been made to the embodiments illustrated in the drawings, and specific language has been used to describe these embodiments. However, no limitation of the scope of the invention is intended by this specific language, and the invention should be construed to encompass all embodiments that would normally occur to one of ordinary skill in the art.

The invention may be described in terms of functional block components and various processing steps. Such functional blocks may be realized by any number of hardware and/or software components configured to perform the specified functions. For example, the invention may employ various integrated circuit components, e.g., memory elements, processing elements, logic elements, look-up tables, and the like, which may carry out a variety of functions under the control of one or more microprocessors or other control devices. Similarly, where the elements of the invention are implemented using software programming or software elements the invention may be implemented with any programming or scripting language such as C, C++, Java, assembler, or the like, with the various algorithms being implemented with any combination of data structures, objects, processes, routines or other programming elements. Functional aspects may be implemented in algorithms that execute on one or more processors. Furthermore, the invention could employ any number of conventional techniques for electronics configuration, signal processing and/or control, data processing and the like. The words "mechanism" and "element" are used broadly and are not limited to mechanical or physical embodiments, but can include software routines in conjunction with processors, etc.

The particular implementations shown and described herein are illustrative examples of the invention and are not intended to otherwise limit the scope of the invention in any way. For the sake of brevity, conventional electronics, control systems, software development and other functional aspects of the systems (and components of the individual operating components of the systems) may not be described in detail. Furthermore, the connecting lines, or connectors shown in the various figures presented are intended to represent exemplary functional relationships and/or physical or logical couplings between the various elements. It should be noted that many alternative or additional functional relationships, physical connections or logical connections may be present in a practical device. Moreover, no item or component is essential to the practice of the invention unless the element is specifically described as "essential" or "critical".

The use of the terms "a" and "an" and "the" and similar referents in the context of describing the invention (especially in the context of the following claims) are to be construed to cover both the singular and the plural. Furthermore, recitation of ranges of values herein are merely intended to serve as a shorthand method of referring individually to each separate value falling within the range, unless otherwise indicated herein, and each separate value is incorporated into the specification as if it were individually recited herein. Finally, the steps of all methods described herein can be performed in any suitable order unless otherwise indicated herein or otherwise clearly contradicted by context. The use of any and all examples, or exemplary language (e.g., "such as" or "for example") provided herein, is intended merely to better illuminate the invention and does not pose a limitation on the scope of the invention unless otherwise claimed. Numerous modifications and adaptations will be readily apparent to those skilled in this art without departing from the spirit and scope of the invention.

What is claimed is:

1. A circuit board assembly comprising:
    a first circuit board comprising a first circuit pattern formed on a surface of the first circuit board, and an opening that is adjacent to the first circuit pattern; and
    a second circuit board comprising a second circuit pattern aligned with the first circuit pattern and a protection film that is applied to a surface of the second circuit board so as to form a hollow place located corresponding to the opening,
    wherein the first circuit pattern is formed outside a projected periphery of the opening, and the second circuit pattern is formed outside the hollow place,
    wherein at least one of the first circuit board and the second circuit board is a flexible circuit board; and
    wherein the first circuit board and the second circuit board are combined with each other to electrically connect the first circuit pattern with the second circuit pattern.

2. The circuit board assembly of claim 1, wherein the first circuit board has a flexible property.

3. The circuit board assembly of claim 1, wherein the hollow place is larger than the opening.

4. The circuit board assembly of claim 1, wherein an electrically conductive adhesive is disposed between the first circuit pattern and the second circuit pattern.

5. The circuit board assembly of claim 1, wherein the first circuit board comprises a first solder portion that is spaced apart from the first circuit pattern, and the second circuit board comprises a second solder portion that is spaced apart from the second circuit pattern and is disposed corresponding to the first solder portion and is combined with the first solder portion using a solder.

6. The circuit board assembly of claim 1, wherein the first circuit pattern and the second circuit pattern are combined with each other using a solder.

7. The circuit board assembly of claim 1, wherein the first and second circuit boards comprise corresponding pluralities of said first and second circuit patterns spaced along an edge of the opening and the hollow place.

8. A method of assembling circuit boards comprising:
    preparing a first circuit board comprising a first circuit pattern formed on a surface of the first circuit board, and an opening that is adjacent to the first circuit pattern, wherein the first circuit pattern is formed outside a projected periphery of the opening;
    preparing a second circuit board comprising a second circuit pattern that is aligned with the first circuit pattern;
    wherein at least one of the first circuit board and the second circuit board is a flexible circuit board;
    applying a protection film on a surface of the second circuit board so as to form a hollow place located corresponding to the opening, wherein the second circuit pattern is formed outside the hollow place; and
    combining the first circuit board and the second circuit board to connect the first circuit pattern electrically to the second circuit pattern.

9. The method of claim 8, wherein the combining of the first circuit board and the second circuit board comprises:
    disposing an electrically conductive adhesive between the first circuit pattern and the second circuit pattern; and
    compressing the first circuit board and the second circuit board.

10. The method of claim 8, further comprising applying a solder to the surface of either the first circuit pattern or the second circuit pattern, wherein the combining of the first circuit board and the second circuit board comprises:
    contacting the first circuit board and the second circuit board in such a way that the first circuit pattern contacts the second circuit pattern; and
    heating a contact portion between the first circuit board and the second circuit board.

11. The method of claim 8 wherein:
    the first circuit board comprises a plurality of said first circuit patterns spaced along an edge of the opening;
    the second circuit board comprises a corresponding plurality of said second circuit patterns ; and
    the combining of the first circuit board and the second circuit board comprises connecting said first circuit patterns electrically to corresponding ones of said second circuit patterns.

12. A circuit board assembly comprising:
a first circuit board comprising a first circuit pattern formed on a surface of the first circuit board, and an opening that is adjacent to the first circuit pattern; and
a second circuit board comprising a second circuit pattern corresponding to the first circuit pattern and a protection film that is applied to a surface of the second circuit board so as to form a hollow place located corresponding to the opening,
wherein the first circuit board and the second circuit board are combined with each other to electrically connect the first circuit pattern with the second circuit pattern,
wherein the first circuit pattern is formed outside a projected periphery of the opening to be separated from the opening and the second circuit pattern is formed outside the hollow place to be separated from the hollow place, and
wherein a region where the first circuit pattern and the second circuit pattern are electrically connected is located outside the opening of the first circuit board and outside the hollow place of the second circuit board.

13. A method of assembling circuit boards comprising:
preparing a first circuit board comprising a first circuit pattern formed on a surface of the first circuit board, and an opening that is adjacent to the first circuit pattern;
preparing a second circuit board comprising a second circuit pattern corresponding to the first circuit pattern;
applying a protection film on a surface of the second circuit board so as to form a hollow place located corresponding to the opening; and
combining the first circuit board and the second circuit board to connect the first circuit pattern electrically to the second circuit pattern,
wherein the first circuit pattern is formed outside a projected periphery of the opening to be separated from the opening and the second circuit pattern is formed outside the hollow place to be separated from the hollow place, and
wherein a region where the first circuit pattern and the second circuit pattern are electrically connected is located outside the opening of the first circuit board and outside the hollow place of the second circuit board.

* * * * *